(12) United States Patent
Arnold

(10) Patent No.: US 7,532,094 B2
(45) Date of Patent: May 12, 2009

(54) LINEAR ANTENNA SWITCH ARM AND A FIELD EFFECT TRANSISTOR

(75) Inventor: Ronald Arnold, Milton Keynes (GB)

(73) Assignee: RFMD (UK) Limited, Newton Aycliffe (GB)

(*) Notice: Subject to any disclaimer, the term of this patent is extended or adjusted under 35 U.S.C. 154(b) by 125 days.

(21) Appl. No.: 11/769,962

(22) Filed: Jun. 28, 2007

(65) Prior Publication Data
US 2008/0012782 A1 Jan. 17, 2008

(30) Foreign Application Priority Data
Jun. 28, 2006 (GB) ................. 0612794.8

(51) Int. Cl.
H01P 1/15 (2006.01)
(52) U.S. Cl. .................... 333/262; 333/103
(58) Field of Classification Search ............... None
See application file for complete search history.

(56) References Cited

U.S. PATENT DOCUMENTS

| 6,218,890 B1 | 4/2001 | Yamaguchi et al. |
| 6,803,680 B2 * | 10/2004 | Brindle et al. ............... 307/115 |
| 7,286,001 B2 * | 10/2007 | Nakatsuka et al. .......... 327/308 |
| 7,345,521 B2 * | 3/2008 | Takahashi et al. ........... 327/308 |
| 2001/0040479 A1 * | 11/2001 | Zhang ........................ 327/427 |
| 2005/0263799 A1 | 12/2005 | Nakatsuka et al. |
| 2005/0270083 A1 | 12/2005 | Nakatsuka et al. |
| 2006/0261912 A1 | 11/2006 | Miyagi et al. |
| 2008/0042776 A1 * | 2/2008 | Nakajima et al. ........... 333/101 |

OTHER PUBLICATIONS

Search Report for Application No. GB0712385.4, date of search Oct. 4, 2007.

* cited by examiner

*Primary Examiner*—Benny Lee
*Assistant Examiner*—Alan Wong
(74) *Attorney, Agent, or Firm*—Withrow & Terranova, P.L.L.C.

(57) ABSTRACT

A linear antenna switch arm comprising a field effect transistor comprising a source, a drain and a plurality of gates; a signal line connected between source and drain, the signal line comprising at least one signal line resistor; at least one gate being connected to the signal line by a connection line, the join between connection line and signal line comprising a node; the at least one gate being selected from the plurality of gates such that the adjacent gates on each side of the connected gates are not connected to the signal line.

12 Claims, 5 Drawing Sheets

LINEAR ANTENNA SWITCH ARM AND A FIELD EFFECT TRANSISTOR

The subject patent application claims priority to and all the benefits of United Kingdom Patent Application No. 0612794.8, which was filed on 28 Jun. 2006 with The UK Patent Office.

The present invention relates to a linear antenna switch arm and also to a field effect transistor. More particularly, but not exclusively, the present invention relates to a linear antenna switch arm comprising a field effect transistor having a plurality of gates, at least one being connected to a signal path extending between source and drain, the signal path including a resistor, the gates on each side of the connected gate not being connected to the signal path.

Antenna switches are used in applications requiring a time division multiple access method, for example GSM and UMTS cellular phones. Series shunt configurations are often used, with a single pole and several throws, the series devices connecting alternatively either of a receive or transmit port to the single pole, and the shunt devices isolating the non-used ports. Field effect transistors are used to realise the series or shunt devices, the input being the drain and the output the source, or vice-versa. The signal passes through the conductive channel.

When reaching the single pole, the signal "sees" one or several OFF arms in parallel. In order to transmit high power signals such as GSM at its nominal maximum power and in order to maintain a low bias voltage to drive the switch, the voltage swing present at the pole must not turn on the FET present in the OFF arm. Several FETs are therefore used in series in order to spread the high voltage across a high number of junctions and the junctions are kept at a floating bias.

However, each of the FETs constituting the OFF arm can be modelled by a highly non linear shunt capacitance, thus introducing non linearities in the switched signal.

The present invention seeks to overcome this problem by providing a linear antenna switch arm which can be used as part of a linear antenna switch.

Accordingly, in a first aspect the present invention provides a linear antenna switch arm comprising
a field effect transistor comprising a source, a drain and a plurality of gates;
a signal line connected between source and drain, the signal line comprising at least one signal line resistor;
at least one gate being connected to the signal line by a connection line, the join between connection line and signal line comprising a node;
the at least one gate being selected from the plurality of gates such that the adjacent gates on each side of the connected gate are not connected to the signal line.

The linear antenna switch arm according to the invention can be employed as part of a linear antenna switch with the signal input and output ports being connected to the source and drain respectively (or vice versa).

Preferably, the connection line comprises a resistor.

Preferably, a signal line resistor is arranged between source and node.

Alternatively or additionally, a signal line resistor is arranged between drain and node.

Preferably, a plurality of gates are connected to the signal line by connection lines, the signal line and connection lines joining at nodes, the plurality of gates being selected such that each connected gate has adjacent gates on each side not connected to the signal line.

Preferably, at least some of the connection lines comprise resistors.

More preferably, each of the connection lines comprises a resistor.

At least one signal line resistor can be arranged between nodes in the signal line.

Alternatively, the nodes can be short circuited together by the signal line.

Preferably, the source and drain comprise a plurality of source and drain fingers respectively, the source and drain fingers beings interdigitated and spaced apart to define a meandering path therebetween, each gate comprising a gate strip extending along the meandering path.

In a further aspect of the invention there is provided a field effect transistor comprising at least five gates.

The present invention will now be described by way of example only and not in any limitative sense with reference to the accompanying drawings in which FIG. 1 shows a linear antenna switch arm according to the invention;

Figure 4:
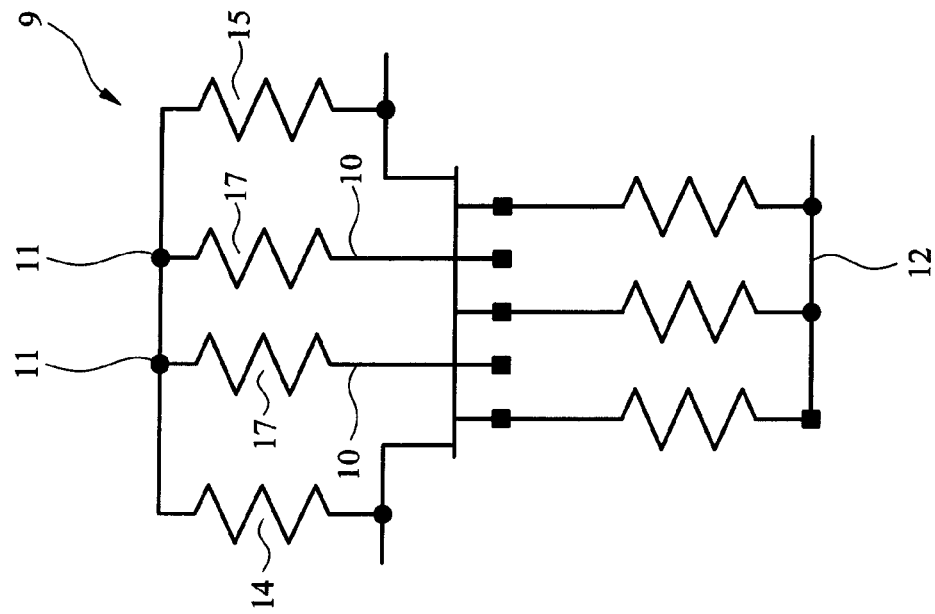
Figure 4:
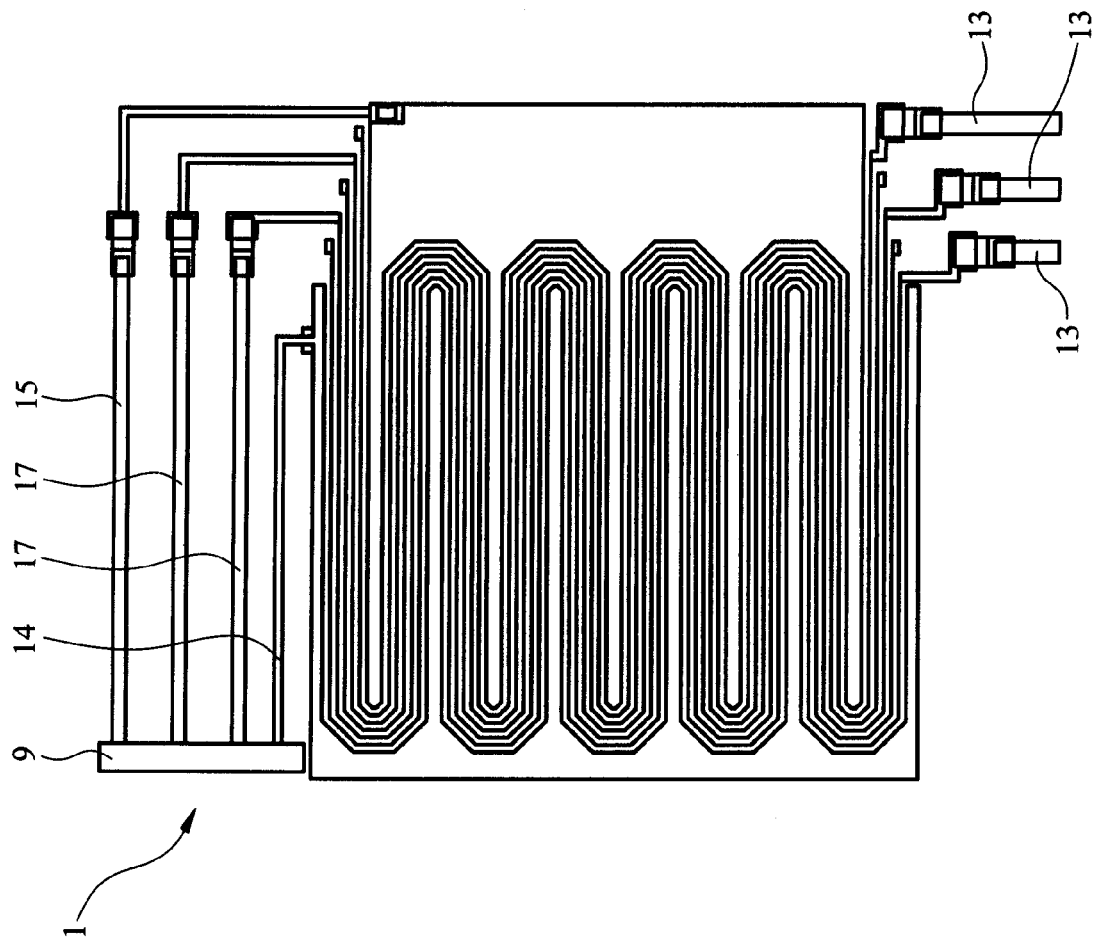
Figure 5:
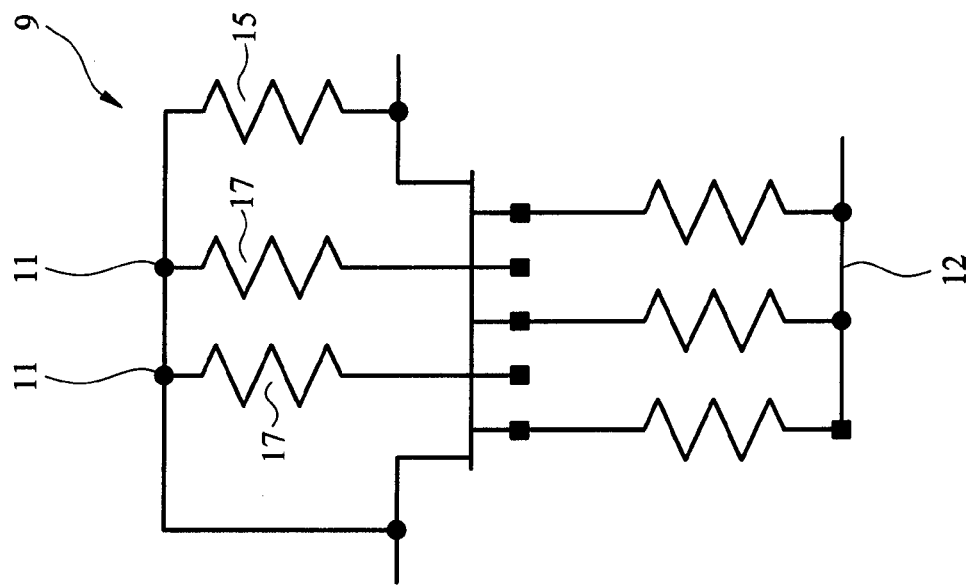
Figure 5:
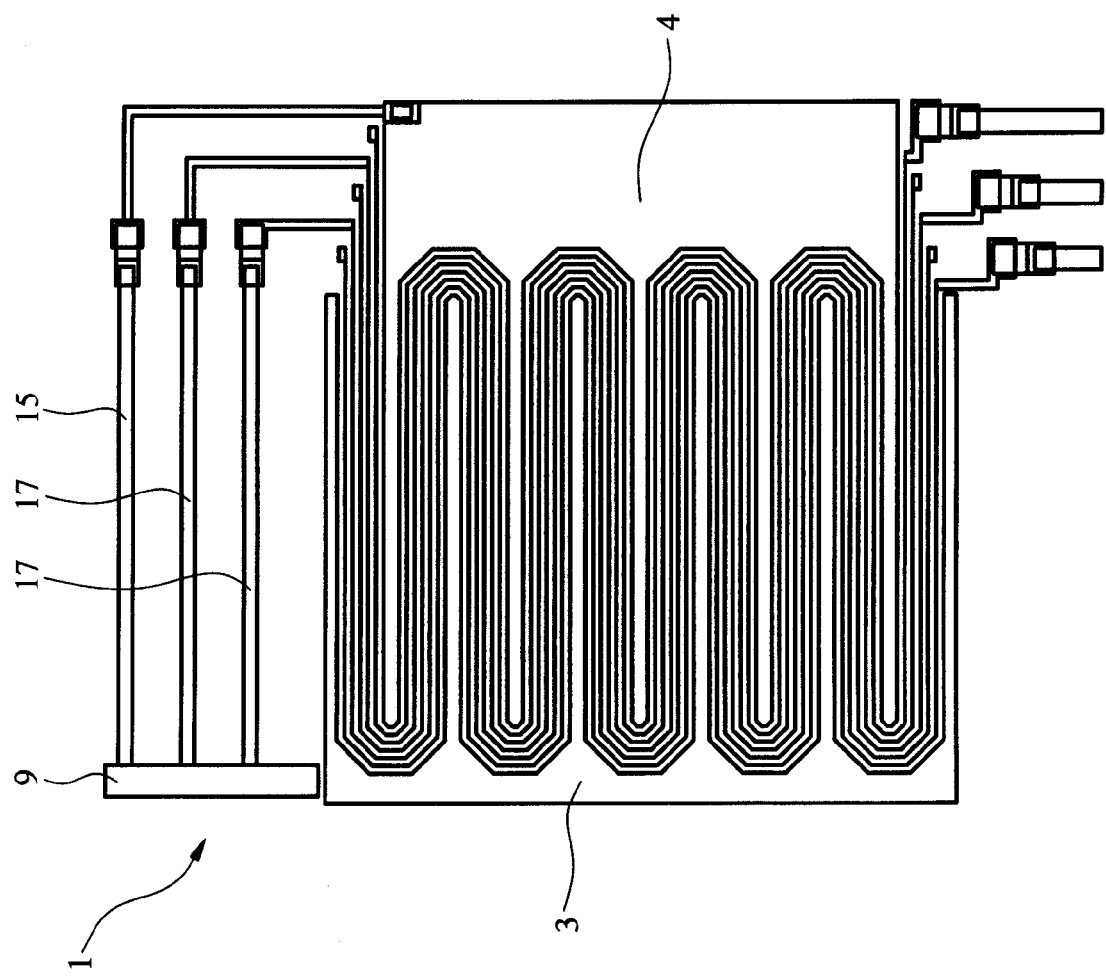

FIG. 4 further embodiment of a linear antenna switch arm according to the invention; and FIG. 5 further embodiment of a linear antenna switch arm according to the invention.

Figure 1:
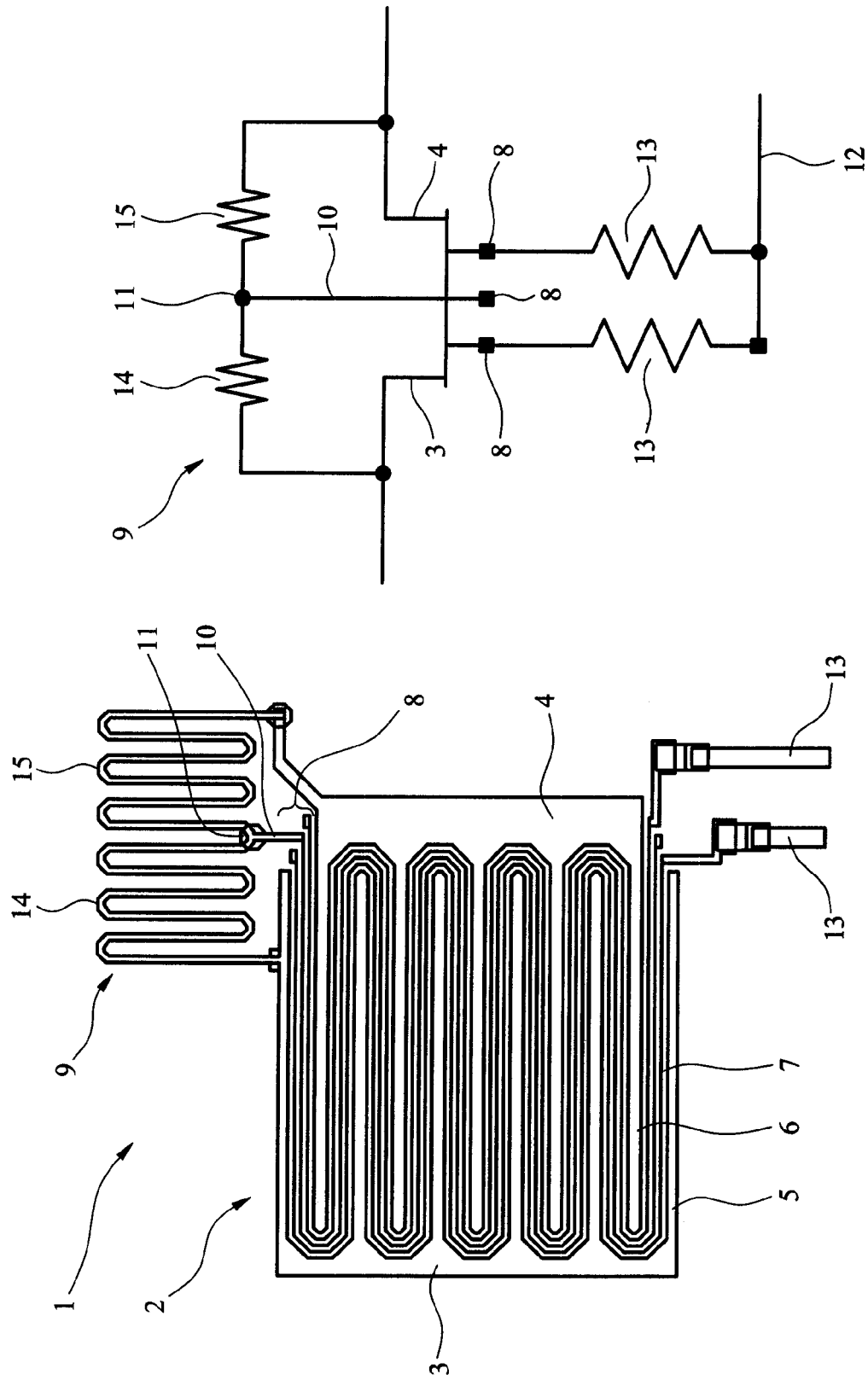

Shown in FIG. 1 is a linear antenna switch arm 1 according to the invention. The linear antenna switch arm 1 comprises a field effect transistor 2 which in turn comprises a source 3 and a drain 4 on a substrate (not shown). The source 3 and drain 4 comprise a plurality of source and drain fingers 5,6 respectively. The source and drain fingers 5,6 are interdigitated and slightly spaced apart to define a meandering path 7 therebetween. Extending along the meandering path 7 are a plurality of electrically conducting gate strips 8. The gate strips 8 have a rectifying effect. A change in voltage on a gate strip 8 causes a change in a depletion layer beneath the gate strip 8 so changing current flow between source 3 and drain 4 as is known.

A signal line 9 extends between source 3 and drain 4. The centre gate strip 8 is connected to the signal line 9 by a connection line 10, the join between the connection line 10 and signal line 9 comprising a node 11. The gates 8 on either side of the connected gate 8 are not connected to the signal line 9. The gate 8 connected to the signal line 9 is allowed to float. The remaining gates 8 are connected to a control line 12 via resistors 13. The signal line 9 comprises a first signal line resistor 14 between source 3 and node 11 and a second signal line resistor 15 between drain 4 and node 11.

The circuit shown in FIG. 1 can act as a linear antenna switch arm 1 with signal input and output ports connected to the source 3 and drain 4 respectively (or vice versa).

Figure 2:
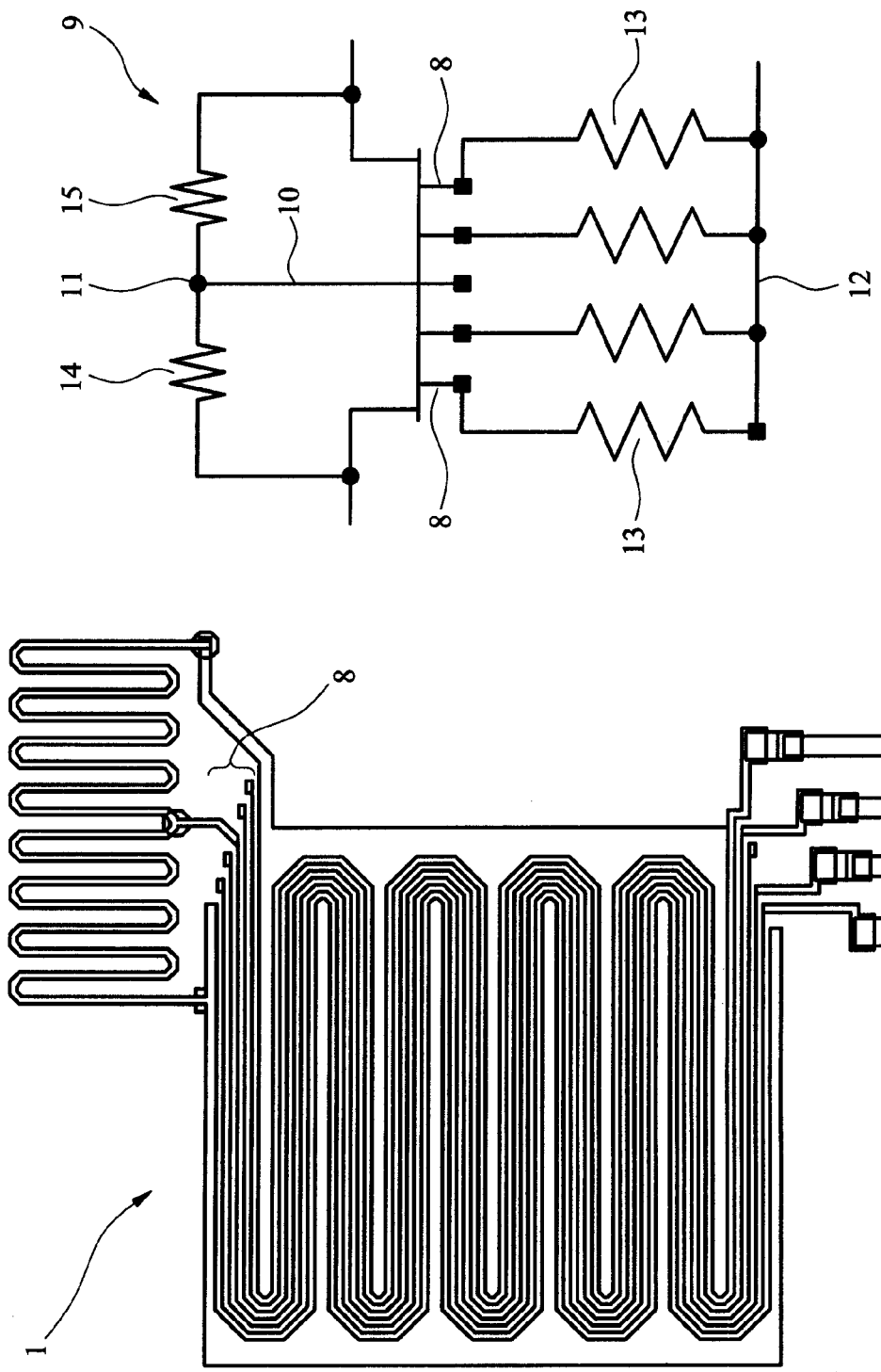
FIG. 2 shows a further embodiment of a linear antenna switch arm according to the invention.

Shown in FIG. 2 is a further embodiment of a linear antenna switch arm 1 according to the invention. This embodiment is similar to that of FIG. 1 except it comprises five gate strips 8 rather than three. Other embodiments having different numbers of gate strips 8 are possible.

Figure 3:
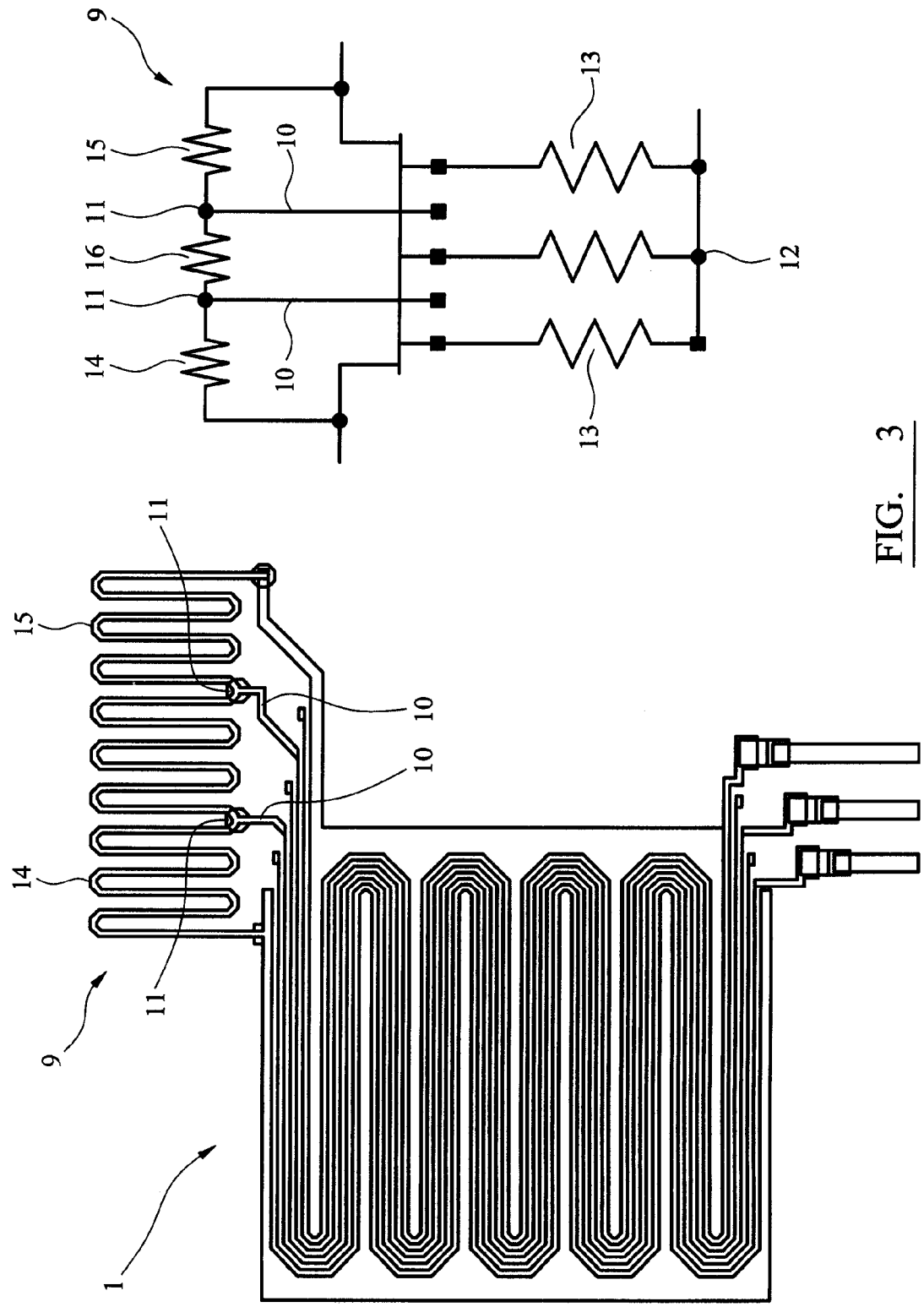
FIG. 3 shows a further embodiment of a linear antenna switch arm according to the invention.

Shown in FIG. 3 is a further embodiment of a linear antenna switch arm 1 according to the invention. As with the embodiment of FIG. 2 the field effect transistor 2 comprises five gate strips 8. Rather than the central gate strip 8 being connected to the signal line 9 it is the two gates 8 adjacent to the central gate 8 which are connected to the signal line 9 by connection lines 10. The connection lines 10 are connected to the signal line 9 at two nodes 11. In addition to the signal line resistors 14,15 of the first and second embodiments, this embodiment comprises a further signal line resistor 16 between nodes 11.

Shown in FIG. 4 is a further embodiment of a linear antenna switch arm 1 according to the invention. This embodiment is similar to that of FIG. 3 except the signal line resistor 16 between nodes is replaced with resistors 17 in the connection lines 10 as shown. The nodes 11 are effectively short circuited together by the signal line 9.

Shown in FIG. 5 is a further embodiment of a linear antenna switch arm 1 according to the invention. This embodiment is similar to that of FIG. 4 except the resistor 14 between source 3 and node 11 is removed. In an alternative embodiment the resistor 15 between drain 4 and node 11 is removed.

Other embodiments having different numbers of gates and numbers of gates connected to the signal line are possible provided that the gates on each side of a connected gate are not connected to the signal line.

Similarly, other arrangements of resistors in the signal and connection lines are possible. In the embodiments shown in FIGS. 4 and 5 all of the connection lines include resistors. In alternative embodiments not all of the connection lines comprise resistors, these are replaced by signal line resistors.

The invention claimed is:

1. A linear antenna switch arm comprising:
   a field effect transistor comprising a source, a drain and a plurality of gates;
   a signal line connected between the source and the drain, the signal line comprising at least one signal line resistor;
   at least one gate being connected to the signal line by a connection line, a join between the connection line and the signal line comprising a node;
   the at least one gate being selected from the plurality of gates such that adjacent gates on each side of the connected gate are not connected to the signal line.

2. A linear antenna switch arm as claimed in claim 1, wherein the connection line comprises a resistor.

3. A linear antenna switch arm as claimed in claim 1, wherein one of the at least one signal line resistor is arranged between the source and the node.

4. A linear antenna switch arm as claimed in claim 3, wherein one of the at least one signal line resistor is arranged between the drain and the node.

5. A linear antenna switch arm as claimed in claim 1, wherein one of the at least one signal line resistor is arranged between the drain and the node.

6. A linear antenna switch arm as claimed in claim 1, wherein a first set of the plurality of gates are connected to the signal line by connection lines, the signal line and the connection lines joining at nodes, the first set of the plurality of gates being selected such that each connected gate has adjacent gates on each side not connected to the signal line.

7. A linear antenna switch arm as claimed in claim 6, wherein at least some of the connection lines comprise resistors.

8. A linear antenna switch arm as claimed in claim 7, wherein each of the connection lines comprises a resistor.

9. A linear antenna switch arm as claimed in claim 6, wherein at least one of the at least one signal line resistor is arranged between the nodes in the signal line.

10. A linear antenna switch arm as claimed in claim 6, wherein the nodes are short circuited together by the signal line.

11. A linear antenna switch arm as claimed in claim 1, wherein the source and the drain comprise a plurality of source and drain fingers respectively, the source and drain fingers beings interdigitated and spaced apart to define a meandering path therebetween, each gate comprising a gate strip extending along the meandering path.

12. A linear antenna switch arm as claimed in claim 1, wherein the plurality of gates of the field effect transistor include at least five gates.

* * * * *